April 8, 1958 R. A. GUDMUNDSEN 2,830,238

HEAT DISSIPATING SEMICONDUCTOR DEVICE

Filed Sept. 30, 1955

RICHARD A. GUDMUNDSEN,
INVENTOR

BY Henry Heyman
ATTORNEY

United States Patent Office 2,830,238

Patented Apr. 8, 1958

2,830,238

HEAT DISSIPATING SEMICONDUCTOR DEVICE

Richard A. Gudmundsen, Inglewood, Calif., assignor to Hughes Aircraft Company, Culver City, Calif., a corporation of Delaware Application September 30, 1955, Serial No. 537,743

8 Claims. (Cl. 317—234)

Figure 1:
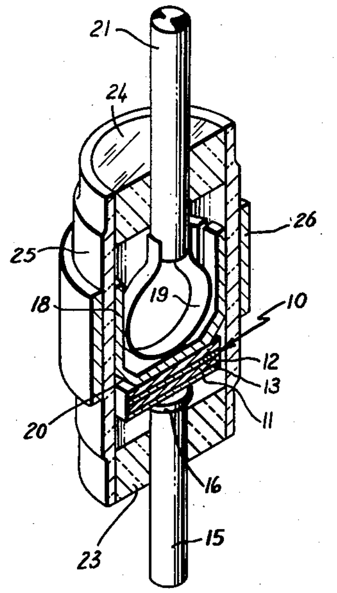

This invention relates to semiconductor signal translating devices and, more particularly, to an improved encapsulation means for semiconductor devices.

Semiconductor materials, such as germanium, silicon, germanium-silicon alloys, indium-antimonide, gallium-antimonide, aluminum-antimonide, indium-arsenide, gallium-arsenide, gallium-phosphorus alloys, and indium-phosphorus alloys, or others hereinafter to be discussed, have been found to be extremely useful in electrical translating devices.

Basic to the theory of operation of semiconductor devices is the concept that current may be carried in two distinctly different manners: namely, " conduction by electrons" or "excess electron conduction" and "conduction by holes" or "deficit electron conduction." The fact that electrical conductivity by both of these processes may occur simultaneously and separately in a semiconductor specimen affords a basis for explaining the electrical behavior of semiconductor devices. One manner in which the conductivity of a semiconductor specimen may be established is by the addition of "active impurities" to the base semiconductor material.

In the semiconductor art, the term "active impurity" is used to denote those impurities which affect the electrical characteristics of a semiconductor material as distinguished from other impurities which have no appreciable effect upon these characteristics. Generally, active impurities are added intentionally to the semiconductor material for producing single crystals or bodies having predetermined electrical characteristics.

Active impurities are classified as either donors—such as antimony, arsenic, bismuth, and phosphorus—or acceptors, such as indium, gallium, thallium, boron, and aluminum. A region of semiconductor material containing an excess of donor impurities and yielding an excess of free electrons is considered to be an impurity-doped N-type region. An impurity-doped P-type region is one containing an excess of acceptor impurities resulting in a deficit of electrons, or stated differently, an excess of holes.

Semiconductor diodes or transistors utilizing semiconductor crystals of any of the above enumerated materials can be produced with stable electrical characteristics even when a small volume of air is allowed to remain in a package or envelope hermetically sealing the crystal. Point-contact semiconductor devices of the type now well known to the art may include a semiconductor crystal and one or more whisker elements in point contact therewith. Among the principal disadvantages of point-contact type semiconductor devices are the inefficient heat-dissipation rate of the devices and the relatively low current-carrying capacities of the devices, both of which are in part caused by the small area of contact between the whisker element and the crystal. It is necessary that point contact devices be operated at relatively low current so as not to exceed their low power dissipation figure.

When a continuous solid specimen such as a crystal or body of semiconductor material has an N-type region adjacent a P-type region, the boundary between the two regions is termed a P–N or N–P junction. The desirability and advantages of junction, or broad-area, semiconductor devices are apparent and by now well known to those skilled in the art. Among the advantages of semiconductor fused junction devices for some applications are included improvements in such characteristics as lower noise, higher power efficiency, lower operating voltage, greater power handling ability, and similar improvements.

Through recent advances in the production of P–N junctions, junction-type semiconductor devices have become increasingly important in the art. Unlike point-contact devices wherein heat dissipation from the contact area is a problem due to the small area of contact between the whisker electrode and the crystal, as discussed hereinbefore, the question of heat dissipation from fused junction devices becomes centered about dissipation from the encapsulation of the device. For example, glass packages such as those described in U. S. Patent No. 2,694,168 for "Glass-Sealed Semiconductor Devices," by Harper Q. North et al., issued November 9, 1954, assigned to the assignee of the present application, have proved particularly advantageous for the encapsulation of semiconductor devices such as point-contact diodes. Glass or vitreous encapsulations such as those described by North have many advantages over the encapsulation methods used prior to that invention, such as a wide operating range of temperatures, improved electrical characteristics, ease of manufacture, and small dimensions. The fact that glass envelopes have poor thermal conduction is a negligible consideration in point-contact devices since the heat dissipating capacity of the device is governed by the small area of contact between the whisker electrode and crystal. However, in order to realize the maximum advantages of glass encapsulation, such as that described by North, or other encapsulations which are formed from materials having poor thermal conductivity, in conjunction with a fused junction device, heat dissipation away from the crystal body must be considered.

Accordingly, it is an object of the present invention to provide improved fused junction semiconductor devices.

It is another object of the present invention to provide glass encapsulated semiconducting or unidirectional conducting or amplifying devices having improved heat dissipation capacity through the glass envelope.

It is another object of this invention to produce fused junction semiconductor devices of exceptionally small size and mounted in glass envelopes filled with air or inert gas, the finished devices having practically negligible stray capacitance, being completely impervious to moisture, and having good power dissipating characteristics.

It is a further object of the present invention to provide fused junction semiconductor devices in which the power rating of the devices is considerably increased by providing good heat dissipation capacity from the glass encapsulation.

It is another object of the present invention to provide a fused junction semiconductor diode which has a path of thermal conductivity from the P–N junction to the inside surface of the envelope.

It is another object of the present invention to provide a glass encapsulated fused junction semiconductor diode which may be easily connected to a thermal heat sink for improved dissipation of heat generated in the semiconductor crystal body.

It is a still further object of the present invention to provide a fused junction semiconductor device in which the thermal conductivity away from the semiconductor crystal is comparable to that of a solid conductor, while maintaining the required electrical insulation.

The device of the present invention comprises a semiconductor crystal body of one conductivity type having a region of semiconductor crystal material of the opposite conductivity type therein forming the P–N junction in the crystal body; a first electrode ohmically affixed to one of said conductive regions; a heat conductive sleeve ohmically affixed to the other conductivity region; a second electrode in contact with the sleeve; and encapsulation means surrounding the crystal body and sleeve insulated from the crystal body, but in thermal contact with the sleeve.

The novel features which are believed to be characteristic of the invention, both as to its organization and method of operation, together with further objects and advantages thereof, will be better understood from the following description considered in connection with the accompanying drawing, in which two embodiments of the invention are illustrated by way of example. It is to be expressly understood, however, that the drawing is for the purpose of illustration and description only and is not intended as a definition of the limits of the invention.

Figure 2:
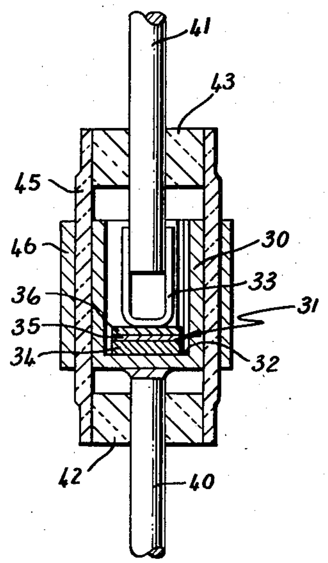

Fig. 1 is a sectional isometric view of a presently preferred embodiment of a fused junction semiconductor diode produced in accordance with the present invention; and Fig. 2 is a sectional view of an alternative embodiment of a semiconductor diode produced in accordance with the present invention.

Referring now to the drawing, wherein like reference characters designate like or corresponding parts throughout the several views, Fig. 1 illustrates a presently preferred embodiment of a fused junction semiconductor diode produced in accordance with the present invention. For purposes of illustration, the production of a fused junction diode in which silicon is utilized as the semiconductor body will be described. It will be recognized, however, that the present invention to be described may also be employed to advantage in fused junction germanium diodes and other fused junction semiconductor devices.

In the presently preferred embodiment of the fused junction diode of the present invention, an N-type silicon crystal body having a P-type fused junction region on one surface thereof, is used as the semiconductor body. Although the method of forming the P–N junction in the semiconductor body does not form a part of this invention and may be produced by one of many methods now known to the art, the P–N junction semiconductor body preferably is formed in accordance with the method disclosed in copending application Serial No. 490,599 for "Evaporation-Fused Junction Semiconductor Devices," by Joseph Maserjian, filed February 25, 1955, now Patent No. 2,789,068, assigned to the assignee of the present application. Thus, referring now to Fig. 1, the semiconductor body may be an N-type silicon crystal 10 having an aluminum-silicon alloy region 12 ohmically connected to a P-type regrown region 13, thus yielding a semiconductor body 10 having three distinct regions, namely an N-type silicon region 11, a P-type silicon region 13, and an aluminum-silicon alloy region 12 ohmically affixed to the P-type silicon region 13.

In the illustrative embodiment shown, the completed diode includes the P–N junction silicon semiconductor body 10 with a Dumet or similar lead 15 ohmically connected to the N-type silicon region 11. The manner of forming the ohmic connection is not critical and may be accomplished by any of the various means known to the art. In this embodiment, a Kovar plate 16 is affixed to the silicon wafer by means of gold paste or solder and the electrode 15 is in turn affixed to the Kovar plate 16 by spot-welding. A heat conductive member 18 formed from material having a high thermal conductivity, such as copper, is in ohmic contact with the aluminum-silicon alloy region 12 of the semiconductor crystal body at the surface of the alloyed region 12 opposed to the surface at which the first electrode 15 is affixed. Since the heat conducting member 18 is in ohmic contact with the aluminum alloy region 12, it is in turn in ohmic contact with the P-type region 13 of the silicon semiconductor body. In this embodiment, the heat conducting member 18 is in the form of a cylinder which is closed at one end and completely open at the other, thus forming a cuplike sleeve.

Within the cup 18 a contact electrode 19 is in ohmic contact with the closed end of the cup at the inner surface 20 of the closed end. Any of the many types of contact electrodes which are now known may be used. However, in this embodiment, a loop contact such as that described in co-pending application Serial No. 534,588, for "Loop Contact for Semiconductor," by Jon H. Myer, filed September 15, 1955, is utilized. The contact electrode 19 is in turn affixed to a second Dumet electrode 21. The encapsulation of the device is accomplished by a first glass bead 23 and a second glass bead 24 forming end portions which are hermetically sealed about the first and second lead electrodes 15, 21, respectively, and a glass tubular body 25 which is in turn hermetically sealed to the glass beads, thus forming a completely enclosed and hermetically sealed encapsulated device. The outer diameter of the heat-dissipating cup or sleeve 18 is substantially equal to the inner diameter of the glass encapsulating tube 25 and is in thermal contact therewith. In order to facilitate a more intimate contact with the inner surface of the glass envelope 25, the wall of the heat conducting cup 18 may be slit lengthwise as shown, thus giving it radial resiliency and enabling it to accommodate irregularities of diameter. Thus, a heat-conducting path is furnished from the semiconductor crystal body 10 in the vicinity of the P–N junction through the heat-conducting cup 18 to a large portion of the inner surface of the cylindrical wall 25 of the semiconductor device.

A thermal heat sink 26 of the type well known to the art may be affixed to the outer surface of the cylindrical portion of the encapsulating envelope. Heat from the sleeve 18 is then transmitted by conduction through the glass wall 25 into the heat sink 26 where it is dissipated into the surrounding air or oil, or a chassis or mounting means to which the heat sink may be affixed.

In the presently preferred embodiment, a glass encapsulation is utilized in which the tubular member 25 has an inside diameter of the order of .060 of an inch. The heat dissipating member 18 is formed of copper and has an outside diameter of the order of .060 of an inch and a wall thickness of the order of .005 of an inch with a length of approximately .060 of an inch. The optimum wall thickness for a given application may vary but can be determined by routine experiment of one skilled in the art.

It has been found that a semiconductor fused junction device, such as a fused junction diode, constructed in accordance with the present invention makes possible an improved power rating of the device which is increased by a factor as large as five (5) over devices of the prior art disposed in the same glass envelope.

In order to clearly describe the present invention, the production of a fused junction silicon diode such as that shown in Fig. 1 will be disclosed in some detail. Although many methods for forming the encapsulating envelope about the semiconductor device may be used, one method which has been found to be particularly satisfactory for manufacturing a glass envelope is disclosed in the patent to Harper Q. North et al., supra.

According to this process, the glass bead 23 of predetermined outside diameter is first threaded onto the metallic wire electrode 15 and is fused to the electrode near one end thereof. The glass bead is then inserted in one end of the glass tube 25 having an inside diameter slightly larger than the outside diameter of the glass bead 23, after which the bead and tube are fused together as, for example, with radiant heat.

The Kovar plate 16 is inserted into the tubular body 25 by means of a vacuum chuck and is spot welded to the first lead electrode 15. The semiconductor body of the type described hereinbefore, which has a P-type region 13, an N-type region 11, and an aluminum-silicon alloy region 12 ohmically affixed to the P-type silicon region 13, is then mounted on the Kovar plate.

If gold paste is used as the means for affixing the semiconductor body to the Kovar plate, the semiconductor body is picked up with a vacuum chuck and is brought into contact with a pool of the thermosetting gold paste and is thereafter removed so that a daub of the paste adheres to the lower surface, or the N-type surface of the semiconductor body. The vacuum chuck and the attached semiconductor body are inserted into the tubular body 25 and positioned against the upper surface of the Kovar plate, the daub of gold paste thereafter adhering to both the semiconductor body and the Kovar plate. One type of gold paste which has been found to give excellent results is Du Pont No. 5780 thermosetting gold paste which is composed of 80% powdered gold dispersed in a thermosetting polymer rosin which is thinned with a liquid consisting of 50% butyl and 50% dibutyl cellosolve.

The vacuum chuck is then de-actuated and withdrawn from the tubular body 25. The combination of the housing subassembly and the crystal subassembly which have now been joined is then placed in an oven and is heated to a temperature of the order of 100° C. approximately one hour to volatilize the solvent or thinner in the thermosetting compound. The combination is then further heated sequentially for approximately 20 minutes at 200° C. and for approximately 30 minutes at 300° C. to polymerize the monomer in the thermosetting compound and thereby form a mechanically rigid temperature-insensitive conductive binder between the electrode and the crystal. The bonding forms an excellent ohmic connection which provides a low-impedance and non-rectifying connection between the semiconductor crystal body and the Kovar plate, and thus between the N-type region 11 of the semiconductor body 10 and the lead electrode 15.

The contact electrode subassembly includes the second electrode 21 over which is fused a second glass bead 24 substantially as shown. The outside diameter of the bead is preferably slightly less than the inside diameter of the tubular member 25. The resilient metallic contact electrode 19 is spot welded to the end of the electrode 21 and is employed in the completed diode, as previously described, to ohmically connect the second electrode 21 with the thermally conducting member 18 which is, in turn, ohmically connected to the P-type region 13 of the silicon semiconductor body. The thermally conducting cup 18 having a cylindrical shape with one closed end is affixed by friction to the resilient contact electrode 19 and the final assembly operation is performed by advancing the contact electrode subassembly, with the heat conducting cup 18 in place, to the open end of the tubular member 25 until the closed end of the cup 18 is in ohmic contact with the surface of the aluminum-silicon alloy region 12 of the semiconductor body 10. The contact subassembly is thereafter advanced a suitable amount to stress the resilient contact electrode against the heat conducting cup and to afford a positive ohmic connection between the resilient contact electrode 19, the heat conducting cup 18, and the aluminum-silicon alloy region 12, and thus the P-type region 13 of the semiconductor body. This operation may be carried out by employing apparatus disclosed in the copending U. S. patent application Serial No. 268,385, for "Methods and Apparatus for Measuring Semiconductor Devices," by Justice N. Carman, Jr., filed January 9, 1952.

At the completion of the above described advancing operation, the second glass bead 24, forming the second end of the encapsulation, is positioned substantially within the open end of the glass tubular member 25. After the contact electrode 19 has been properly positioned within the heat conducting member 18, localized heat is applied to the upper end of the tube 25 adjacent the glass bead 24 by a radiant energy heating source, for example, to fuse the glass bead with the glass tube, thereby forming a unitary glass bead for the fused junction silicon diode in accordance with the present invention, as shown in Fig. 1.

It will be apparent to those skilled in the art that many modifications of the operational steps described above may be made, such as for example, the heat conducting member 18 may be affixed to the aluminum-silicon alloy surface of the semiconductor body prior to the insertion of the contact electrode, in such a manner that a mechanical connection, rather than a pressure connection, is afforded between the heat conducting member 18 and the semiconductor body 10.

Another modification which may be made in the methods of assembling a semiconductor device alters the nature of the connection between the contact electrode 19 and the heat conducting member 18. Although a pressure contact between these elements has been found to produce a good electrical connection, it may be desirable to affix the contact electrode 19 rigidly within the heat-conducting member 18. This may be accomplished by pretinning the contact electrode before the final sealing operation is performed. When heat is thereafter applied to fuse together the glass elements of the envelope, the pre-tinned contact electrode 19 is fused to the inner surface of the end of the heat dissipating member 18.

Referring now to Fig. 2, an alternative embodiment of the present invention is shown. In this embodiment the heat-dissipating member is again a cylindrical cup 30 which is closed at one end and open at the opposite end, and is formed of thermally heat conductive material such as copper. Unlike the embodiment discussed hereinbefore, this alternative embodiment is so constructed that the semiconductor body 31 is in ohmic contact with the inner surface 32 of the closed end of the cup 30, while the contact electrode 33 is in direct contact with the opposed surface of the semiconductor body 31. Again using a silicon P-N junction body such as the one described in conjunction with the embodiment of Fig. 1, the semiconductor body 31 has an N-type silicon region 34, a P-type fused junction silicon region 35, and an aluminum-silicon alloy region 36 ohmically affixed to the P-type silicon region 35. Thus, a first lead electrode 40 is ohmically connected to the outer surface of the closed end of the thermally conductive metallic sleeve or cup 30. The silicon body 31 is affixed to the inner surface of the closed end of cup 30 and thus ohmically connected through the thermally conductive cup 30 to the first electrode 40. A second lead electrode 41 is ohmically affixed to the contact electrode 33 which, in turn, is in ohmic contact with the aluminum-silicon alloy region 36 of the semiconductor body 31 and thus to the P-type silicon region 35. A first glass bead 42 is hermetically sealed about the first electrode 40 and a second glass bead 43 is hermetically sealed about the second electrode 41. A glass tubular member 45 is, in turn, hermetically sealed to the glass beads 40, 41. The tubular member 45 has an inside diameter substantially equal to the outside diameter of the heat conductive cup 30. In this alternative embodiment it is important to note that the inside diameter of the heat transmitting cup is greater than the greatest dimension across the semiconductor body 31. This is necessary in order that the P-type and N-type regions of the semiconductor body are not shorted. Thus, the heat transmitting sleeve 30 is in contact only with the N-type region 34 of the semiconductor body 31. In order to facilitate again a more intimate contact between the heat conductive member 30 and the inner wall of the glass tubular body 45, the heat conductive cup 30 may be slit to afford radial resiliency.

A heat sink 46 of the type well known to the art may be affixed to the outer surface of the tubular glass member 45 surrounding the side walls of the heat conducting member 30. A heat path is then afforded from the P–N junction region through the heat conducting member 30, through the glass wall and into the heat sink 46 where it is dissipated.

In order to illustrate again the production of a semiconductor device such as that shown in Fig. 2, the steps of assembly will be briefly described. The first glass bead 42 is fused to the first electrode 40 near to the end thereof and the heat transmitting cup 30 is affixed to the end of the electrode 40 by means of spotwelding, for example. The glass tubular member 45 is then fused to the glass bead 40.

Gold paste or solder is then placed on the lower or N-type silicon surface 34 and the semiconductor body 31 is inserted into, and positioned within, the cup 30 by means such as a vacuum chuck. After positioning the semiconductor body 31 such that only the N-type region 34 is in contact with the cup 30, the chuck is deactuated and removed. If gold paste is used, the paste is thermally bonded as described hereinbefore to ohmically and mechanically affix the semiconductor body to the inner surface of the cup.

The second glass bead 43 is fused to the second electrode 41 and the resilient electrode 33 is spot welded, or otherwise affixed, to the end of the electrode 41. The final assembly operation is performed by advancing the contact electrode 33 into the tubular member 45 and into contact with the aluminum alloy region 36 of the semiconductor body 31. It is then additionally advanced to insure good ohmic connection to the aluminum alloy region 36 and thus to the P-type region 35, and the final seal is made by fusing the second glass bead 43 and glass tubular member 45. It is important to note that the contact electrode 33 must be so formed and positioned in this alternative embodiment that it does not contact the heat dissipating cup 30, since it must be in ohmic contact only with the P-type region 35 of the semiconductor body 31.

It will be apparent to those skilled in the art that many modifications of the present invention may be made and that the use of a heat dissipating member such as that disclosed by the present invention may be advantageously utilized in encapsulations which are formed from materials other than glass. It will also be apparent that the steps of production are illustrative only and that the assembly may be accomplished in many ways.

Thus, the present invention provides an improved encapsulated fused junction semiconductor device which has a greater power rating of the device by allowing more efficient heat dissipation from the hermetically sealed enclosure.

What is claimed is:

1. A fused junction semiconductor device comprising: a semiconductor crystal body of one conductivity type having a region of semiconductor crystal material of the opposite conductivity type therein defining a P–N junction; a first electrode ohmically connected to said one conductivity region; a thermally conductive member ohmically affixed to said opposite conductivity region; a second electrode in ohmic contact with said opposite conductivity region; and insulative encapsulation means surrounding said crystal body and said heat conducting member, the inner surface of said insulative encapsulation means contacting said heat conducting member to provide a thermally conductive path from said crystal body.

2. A fused junction semiconductor device comprising: a semiconductor crystal body of one conductivity type having a region of semiconductor crystal material of the opposite conductivity type therein defining a P–N junction; a first electrode ohmically connected to said one conductivity region; a thermally conductive member ohmically affixed to said opposite conductivity region; a second electrode in ohmic contact with said thermally conductive member; and vitreous encapsulation means surrounding said crystal body and said member, the inner surface of said vitreous encapsulation means contacting said heat conducting member to provide a thermally conductive path from said crystal body.

3. A fused junction semiconductor device comprising: a semiconductor crystal body of one conductivity type having a fused P–N junction therein and a region of semiconductor crystal material of the opposite conductivity type adjacent the P–N junction; a first electrode ohmically connected to said one conductivity region; a thermally conductive member ohmically connected to said opposite conductivity region; a second electrode ohmically connected to said thermally conductive member; and vitreous encapsulation means surrounding said crystal body and said thermally conductive member, said encapsulating means having first and second vitreous end walls surrounding and hermetically affixed to said first and second electrodes, respectively, and a vitreous side wall hermetically joining said end walls; the inner surface of said vitreous side wall contacting said thermally conductive member to provide a thermally conductive path from said crystal body.

4. A fused junction semiconductor device comprising: a semiconductor crystal body of one conductivity type having a fused P–N junction therein and a region of semiconductor crystal material of the opposite conductivity type adjacent the P–N junction; a first electrode ohmically connected to said one conductivity region; a thermally conductive member substantially cylindrical in configuration, one end of said member being in ohmic contact with the surface of said opposite conductivity region; a second electrode in ohmic contact with said thermally conductive member; and substantially cylindrical encapsulation means surrounding said crystal body and said member, said encapsulation means being electrically insulated from said crystal body and in thermal contact with said member substantially at the cylindrical surface thereof.

5. A fused junction semiconductor device comprising: a semiconductor crystal body of one conductivity type having a fused P–N junction therein and a region of semiconductor crystal material of the opposite conductivity type adjacent the P–N junction; a first electrode ohmically connected to said one conductivity region; a thermally conductive member ohmically connected to said opposite conductivity region and substantially cylindrical in configuration; a second electrode in ohmic contact with said thermally conductive member; and a vitreous envelope surrounding said crystal body and said thermally conductive member, said envelope being cylindrical in configuration and having an inside diameter substantially equal to the outside diameter of said cylindrical thermally conducting member, the inner cylindrical surface of said envelope being in thermal contact with the outer cylindrical surface of said thermally conductive member.

6. A fused junction semiconductor device comprising: a semiconductor crystal body of one conductivity type having a fused P–N junction therein and a region of semiconductor crystal material of the opposite conductivity type adjacent the P–N junction; a first electrode ohmically connected to said one conductivity region; a thermally conductive member ohmically connected to said opposite conductivity region and substantially cylindrical in configuration, said crystal body being disposed within said cylindrical member; a second electrode in ohmic contact with said thermally conductive member; and a vitreous envelope surrounding said crystal body and said thermally conductive member, said envelope being cylindrical in configuration and having an inside diameter substantially equal to the outside diameter of said cylindrical thermally conducting member, the inner cylindrical surface of said envelope being in thermal contact with the outer cylindrical surface of said thermally conductive member.

7. A fused junction semiconductor device comprising: a semiconductor crystal body of one conductivity type having a fused P–N junction therein and a region of semiconductor crystal material of the opposite conductivity type adjacent the P–N junction; a first electrode ohmically connected to said one conductivity region; a cylinder of thermally conductive material having cylindrical side walls and one closed end, said closed end being in ohmic contact with said opposite conductivity region of said crystal body; a second electrode in ohmic contact with said closed end of said cylinder; vitreous encapsulation means surrounding said crystal body and said cylinder, said encapsulation means being substantially cylindrical in configuration having end walls and a tubular side wall, said tubular side wall having an inside diameter substantially equal to the outside diameter of said cylinder and being in thermal contact therewith.

8. A fused junction semiconductor device comprising a semiconductor crystal body of one conductivity type having a P–N junction therein and a region of semiconductor material of the opposite conductivity type adjacent the P–N junction; a first electrode ohmically affixed to said one conductivity region of said semiconductor body; a thermally conductive substantially cylindrical body having a closed end and an open end, said closed end being in ohmic contact with the surface of said region of opposite conductivity type; a second electrode in contact with said thermally conductive body; a glass envelope surrounding said crystal body, said glass envelope comprising end portions and a cylindrical side wall, said cylindrical side wall having an inside diameter substantially equal to the outside diameter of said cylindrical thermally conductive body, said envelope being electrically insulated from said crystal body and in thermal contact with said body; and a heat sink thermally connected to the outer cylindrical surface of said envelope.

References Cited in the file of this patent

UNITED STATES PATENTS

| | | |
|---|---|---|
| 2,639,380 | Hollmann | May 19, 1953 |
| 2,725,505 | Webster et al. | Nov. 29, 1955 |
| 2,735,050 | Armstrong | Feb. 14, 1956 |
| 2,752,541 | Losco | June 26, 1956 |